(12) United States Patent
Inada et al.

(10) Patent No.: US 7,710,191 B2
(45) Date of Patent: May 4, 2010

(54) ENABLING HIGHER OPERATION SPEED AND/OR LOWER POWER CONSUMPTION IN A SEMICONDUCTOR INTEGRATED CIRCUIT DEVICE

(75) Inventors: Hiroshi Inada, Osaka (JP); Akio Hirata, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/907,165

(22) Filed: Oct. 10, 2007

(65) Prior Publication Data
US 2008/0088356 A1     Apr. 17, 2008

(30) Foreign Application Priority Data
Oct. 12, 2006   (JP)   ............... 2006-279193

(51) Int. Cl.
*H03K 3/01*     (2006.01)
(52) U.S. Cl. .................................. 327/534
(58) Field of Classification Search .......... 327/534–535
See application file for complete search history.

(56) References Cited

U.S. PATENT DOCUMENTS

| 6,462,527 | B1* | 10/2002 | Maneatis ..................... 323/315 |
| 6,466,077 | B1 | 10/2002 | Miyazaki et al. |
| 6,809,968 | B2* | 10/2004 | Marr et al. ............. 365/185.24 |
| 6,943,613 | B2 | 9/2005 | Miyazaki et al. |
| 6,982,591 | B2* | 1/2006 | Abadeer et al. ............. 327/543 |
| 7,030,637 | B2* | 4/2006 | Berthold et al. ............. 324/763 |
| 7,138,851 | B2 | 11/2006 | Sumita et al. |
| 7,304,532 | B2* | 12/2007 | Kim et al. .................... 327/543 |
| 7,498,865 | B2* | 3/2009 | Sakiyama et al. ........... 327/534 |
| 2005/0116765 | A1* | 6/2005 | Sakiyama et al. ........... 327/534 |
| 2007/0194837 | A1* | 8/2007 | Chiou et al. ................. 327/543 |
| 2007/0234168 | A1 | 10/2007 | Moriwaki et al. |

FOREIGN PATENT DOCUMENTS

| JP | 2001-345693 | 12/2001 |
| JP | 2004-165649 | 6/2004 |
| JP | 2007-243160 | 9/2007 |

OTHER PUBLICATIONS

Hirata, Akio et al., "The Cross Charge-control Flip-Flop; a Low-power and High-Speed Flip- Flop Suitable for Mobile Appliation SoCs", 2005 Symposium on VLSI Circuits Digest of Technical Papers, pp. 306-307.

* cited by examiner

*Primary Examiner*—Quan Tra
(74) *Attorney, Agent, or Firm*—McDermott Will & Emery LLP (57) ABSTRACT

A semiconductor integrated circuit device 100A includes: an integrated circuit body 106A having a plurality of MOSFETs on a semiconductor substrate; a plurality of elements 102A to be measured placed on the same substrate as the plurality of MOSFETs; a monitor circuit 105A for selecting an element to be measured whose measured parameter value is in a predetermined rank among the plurality of elements 102A to be measured as an element 101A to be measured for monitoring; and an operation parameter adjustment circuit 107 for adjusting an operation parameter 108 supplied to the integrated circuit body 106A based on the measured parameter 104A of the element to be measured for monitoring.

12 Claims, 12 Drawing Sheets

ENABLING HIGHER OPERATION SPEED AND/OR LOWER POWER CONSUMPTION IN A SEMICONDUCTOR INTEGRATED CIRCUIT DEVICE

CROSS-REFERENCE TO RELATED APPLICATIONS

This application claims priority under 35 U.S.C. §119 on Patent Application No. 2006-279193 filed in Japan on Oct. 12, 2006, the entire contents of which are hereby incorporated by reference.

BACKGROUND OF THE INVENTION

The present invention relates to a semiconductor integrated circuit device, and more particularly to attainment of higher operation speed and lower power consumption in a semiconductor integrated circuit device.

In recent years, the market of multi-functional and low-power equipment has expanded, and semiconductor integrated circuit devices mounted in such equipment have been requested to attain higher operation speed and lower power consumption.

As a conventional semiconductor integrated circuit device that attains lower power consumption, a technology disclosed in Japanese Laid-Open Patent Publication No. 2004-165649 (Patent Literature 1), for example, is known. A semiconductor integrated circuit device described in Patent Literature 1 includes a substrate voltage adjustment circuit that adjusts the substrate voltage of a semiconductor substrate so that the drain current of a MOSFET for monitoring (element to be measured for monitoring) and the drain current of a plurality of MOSFETs in an integrated circuit body are constant. In this semiconductor integrated circuit device, the substrate voltage of MOSFETs is controlled to prevent a drain current at a gate voltage value in a subthreshold range or saturation range of the MOSFETs from having dependencies on the temperature and process variations.

Figure 11:
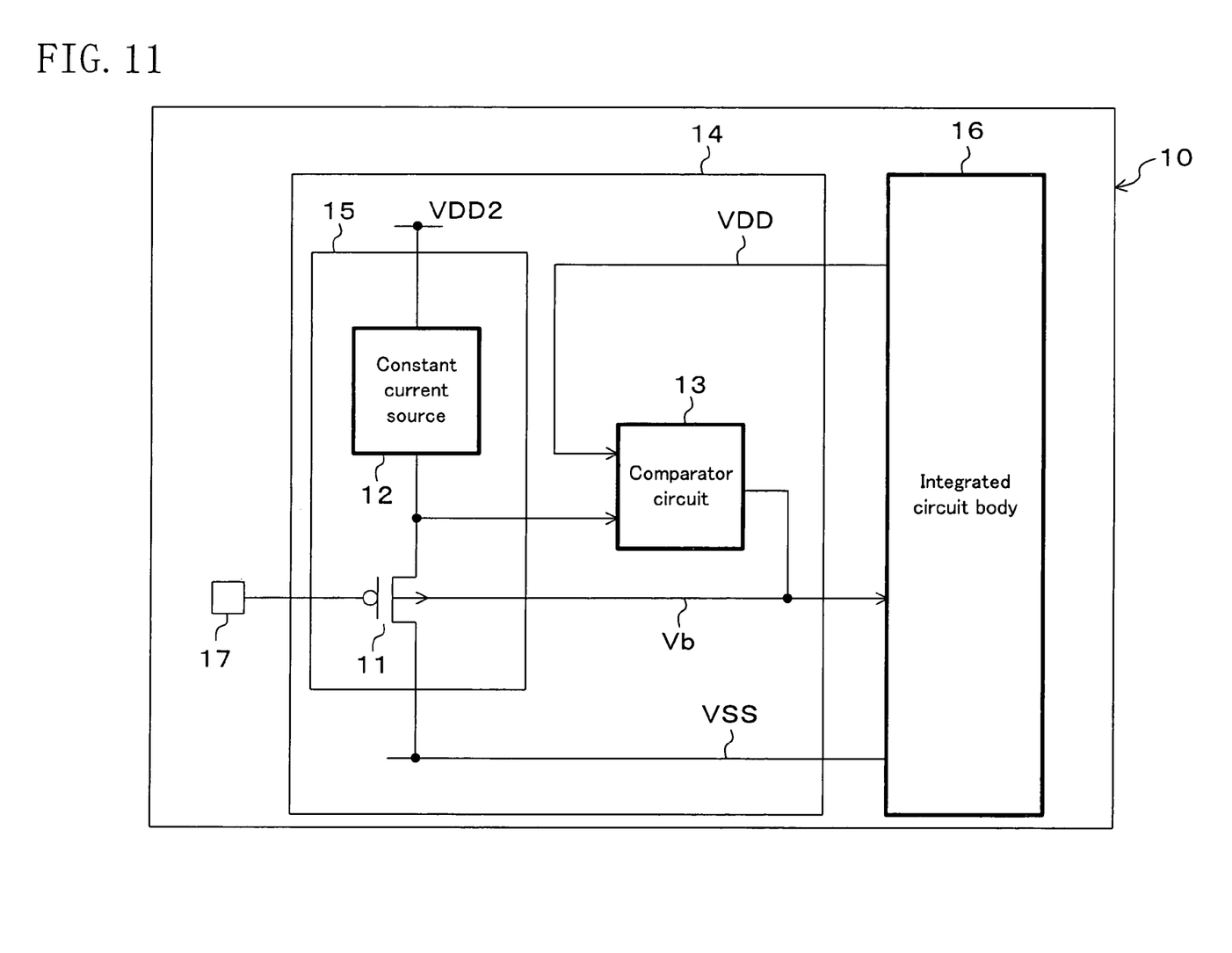
FIG. 11 is a block diagram of the entire configuration of a conventional semiconductor integrated circuit device.

FIG. 11 is a block diagram of the entire structure of a semiconductor integrated circuit device adopting the substrate voltage adjustment technology disclosed in Patent Literature 1.

Referring to FIG. 11, a semiconductor integrated circuit device 10 includes: an integrated circuit body 16 having a plurality of MOSFETs on a semiconductor substrate; a drain current monitor circuit 15 for monitoring the drain current of a MOSFET 11 for monitoring; and a substrate voltage adjustment circuit 14 for adjusting the substrate voltage Vb of the semiconductor substrate so that the drain current of the MOSFET 11 for monitoring is constant.

The drain current monitor circuit 15 includes a constant current source 12. The MOSFET 11 for monitoring is formed on the same substrate as the plurality of MOSFETs in the integrated circuit body 16, and the gate of the MOSFET 11 for monitoring is set at a given voltage 17 equal to or less than the power supply voltage VDD for the integrated circuit body 16.

The substrate voltage adjustment circuit 14 includes a comparator circuit 13 that compares the source potential of the MOSFET 11 for monitoring with a preset reference potential in the state of the drain terminal of the MOSFET 11 for monitoring and the drain terminals of the plurality of MOSFETs in the integrated circuit body 16 being connected to the ground potential VSS. The comparison result from the comparator circuit 13 is fed back to the substrate voltage Vb of the MOSFET 11 for monitoring to thereby adjust the substrate voltage Vb.

As a semiconductor integrated circuit device that attains both higher operation speed and lower power consumption, there is a technology disclosed in Japanese Laid-Open Patent Publication No. 2001-345693 (Patent Literature 2), for example, in which characteristic variations of semiconductor integrated circuit devices are suppressed to improve the circuit performance.

Figure 12:
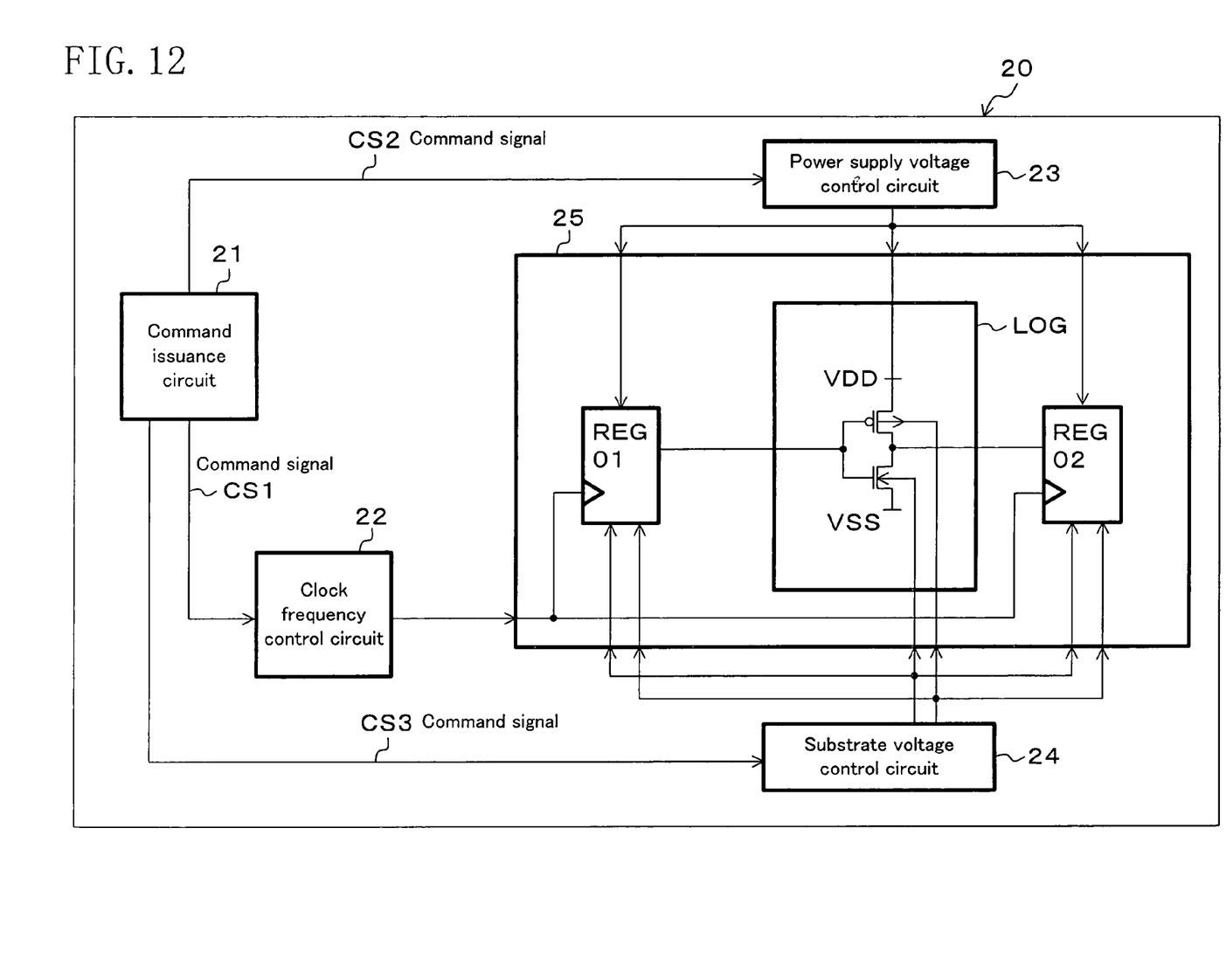
FIG. 12 is a block diagram of the entire configuration of another conventional semiconductor integrated circuit device.

FIG. 12 is a block diagram of the entire configuration of a semiconductor integrated circuit device disclosed in Patent Literature 2.

A semiconductor integrated circuit device 20 of FIG. 12 monitors a chain of serially-connected inverter circuits as an element to be measured for monitoring (not shown) with a monitor circuit (not shown), and controls the operation frequency, the power supply voltage and the substrate voltage based on a measured parameter of the element to be measured for monitoring.

In the semiconductor integrated circuit device 20, the measured parameter of the element to be measured for monitoring is supplied to a command issuance circuit 21. Thereafter, based on command signals CS1, CS2 and CS3 from the command issuance circuit 21, a clock frequency control circuit 22, a power supply voltage control circuit 23 and a substrate voltage control circuit 24 respectively control the clock signal, the power supply voltage and the substrate voltage, and then supply the resultant clock signal, power supply voltage and substrate voltage to an integrated circuit body 25 that includes register circuits REG01 and REG02 and a logic circuit LOG. With this semiconductor integrated circuit device 20, the power consumption can be reduced without lowering the operation speed, or the operation speed can be improved without increasing the power consumption.

However, the semiconductor integrated circuit devices of Patent Literature 1 and Patent Literature 2 described above have the following problems. If the element to be measured for monitoring itself has fabrication variations in which variations occur locally and randomly during fabrication (hereinafter, called "local variations"), such local variations may affect the adjustment of an operation parameter such as the substrate voltage.

The local variations increase in submicron processes due to fluctuations caused by randomness of a discrete impurity distribution and characteristic fluctuations caused by line edge roughness of gate polysilicon. For this reason, in the case that the element to be measured for monitoring is a MOSFET in Patent Literature 1 and Patent Literature 2 described above, it is unknown whether the measured parameter that is the drain current of the MOSFET for monitoring is the maximum, the minimum or the median in the local variation distribution. If the substrate voltage control is performed at the time when the drain current of the MOSFET for monitoring is characterized as the maximum in the local variation distribution, the integrated circuit body may possibly fail to operate.

Also, in the case that the element to be measured for monitoring is a delay circuit composed of serially connected inverter circuits, the integrated circuit body may possibly fail to operate if a delay circuit that is minimum in delay time in the local variation distribution is monitored as the element to be measured for monitoring.

SUMMARY OF THE INVENTION

An object of the present invention is providing a semiconductor integrated circuit device capable of attaining higher operation speed and lower power consumption even when a plurality of elements to be measured provided in the semiconductor integrated circuit device have local variations.

To attain the object described above, a semiconductor integrated circuit device of the present invention includes: an integrated circuit body having a plurality of MOSFETs on a semiconductor substrate; a plurality of elements to be measured placed on the same substrate as the plurality of MOSFETs; a monitor circuit for selecting an element to be measured whose measured parameter value is in a predetermined rank from the plurality of elements to be measured as an element to be measured for monitoring; and an operation parameter adjustment circuit for adjusting an operation parameter supplied to the integrated circuit body based on the measured parameter of the element to be measured for monitoring.

As described above, the semiconductor integrated circuit device, provided with a plurality of elements to be measured, measures parameters of the respective elements to be measured, and selects an element whose measured parameter is in a predetermined rank as the element to be measured for monitoring, for adjustment of an operation parameter. Accordingly, even if the plurality of elements to be measured respectively have local variations, the operation parameter can be adjusted with a reduced influence of variations in measured parameter caused by the local variations.

When the monitor circuit selects an element to be measured whose measured parameter value is any one of the maximum, the minimum and the median, for example, as the element to be measured for monitoring, the operation parameter adjustment circuit can adjust an operation parameter such as the operation frequency, the power supply voltage and the substrate voltage properly.

DESCRIPTION OF THE PREFERRED EMBODIMENTS

Hereinafter, preferred embodiments of the present invention will be described with reference to the accompanying drawings.

Embodiment 1

Figure 1:
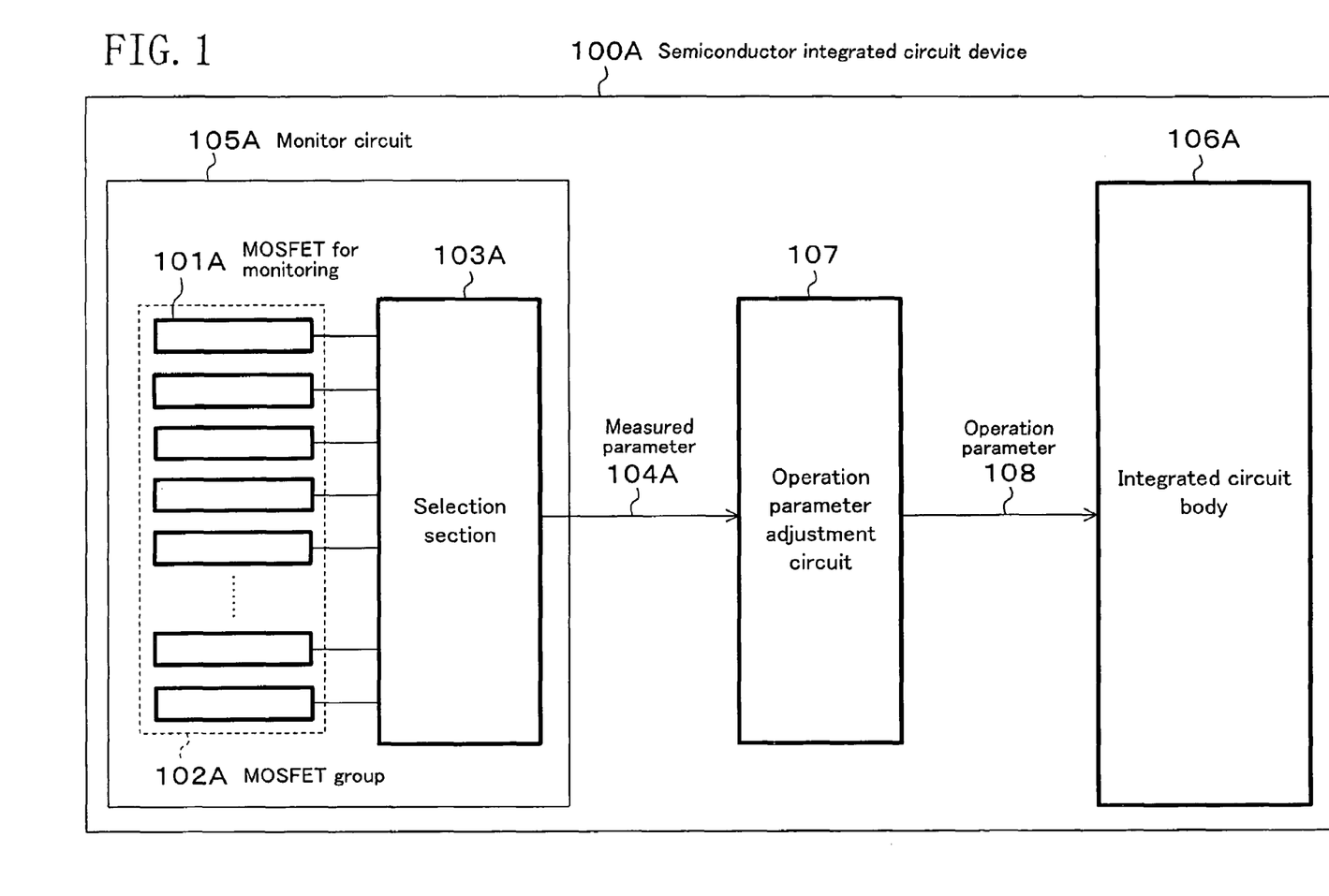
FIG. 1 is a block diagram of the entire configuration of a semiconductor integrated circuit device of Embodiment 1.

FIG. 1 is a block diagram showing the entire configuration of a semiconductor integrated circuit device of Embodiment 1 of the present invention.

Referring to FIG. 1, a semiconductor integrated circuit device 100A includes an integrated circuit body 106A having a plurality of MOSFETs formed on a semiconductor substrate (not shown), a monitor circuit 105A and an operation parameter adjustment circuit 107.

The monitor circuit 105A includes: a MOSFET group 102A composed of a plurality of MOSFETs (a plurality of elements to be measured) formed on the same substrate as the plurality of MOSFETs in the integrated circuit body 106A; and a selection section 103A for selecting a MOSFET 101A for monitoring (an element to be measured for monitoring) from the MOSFET group 102A. The selection section 103A of the monitor circuit 105A selects a MOSFET whose measured parameter value is in a predetermined rank as the MOSFET 101A for monitoring from the MOSFET group 102A.

The operation parameter adjustment circuit 107 adjusts an operation parameter 108 supplied to the integrated circuit body 106A based on a measured parameter 104A of the MOSFET 101A for monitoring.

In this embodiment, first, the selection section 103A of the monitor circuit 105A selects the MOSFET 101A for monitoring from the MOSFET group 102A. In this selection, the selection section 103A measures the drain current value at a given gate voltage value in the subthreshold range or saturation range of each MOSFET in the MOSFET group 102A as a measured parameter, and selects a MOSFET whose drain current value is the median as the MOSFET 101A for monitoring.

Thereafter, based on the drain current value (measured parameter) 104A of the MOSFET 101A for monitoring selected in the monitor circuit 105A, the operation parameter adjustment circuit 107 adjusts the substrate voltage (operation parameter) 108 of the substrate and supplies the resultant substrate voltage 108 to the integrated circuit body 106A.

As described above, the semiconductor integrated circuit device 100A of this embodiment, having the MOSFET group 102A, measures the drain current values of the MOSFETs in the group, selects a MOSFET at the center in the ranking as the MOSFET 101A for monitoring, and adjusts the substrate voltage 108 based on the drain current value 104A of the selected MOSFET. Thus, the substrate voltage can be adjusted with a reduced influence of local variations even if the MOSFETs in the MOSFET group 102A have their local variations.

Although the drain current value was measured as the measured parameter 104A in this embodiment, it is without mentioning that the delay time and the like of the elements to be measured may be measured.

Although the selection section 103A selected a MOSFET whose measured parameter was the median as the MOSFET 101A for monitoring, a MOSFET in another rank, such as that giving the maximum or the minimum, may be selected. Also, the operation parameter 108 adjusted by the operation parameter adjustment circuit 107 may be the operation frequency, the power supply voltage and the like.

Embodiment 2

Figure 2:
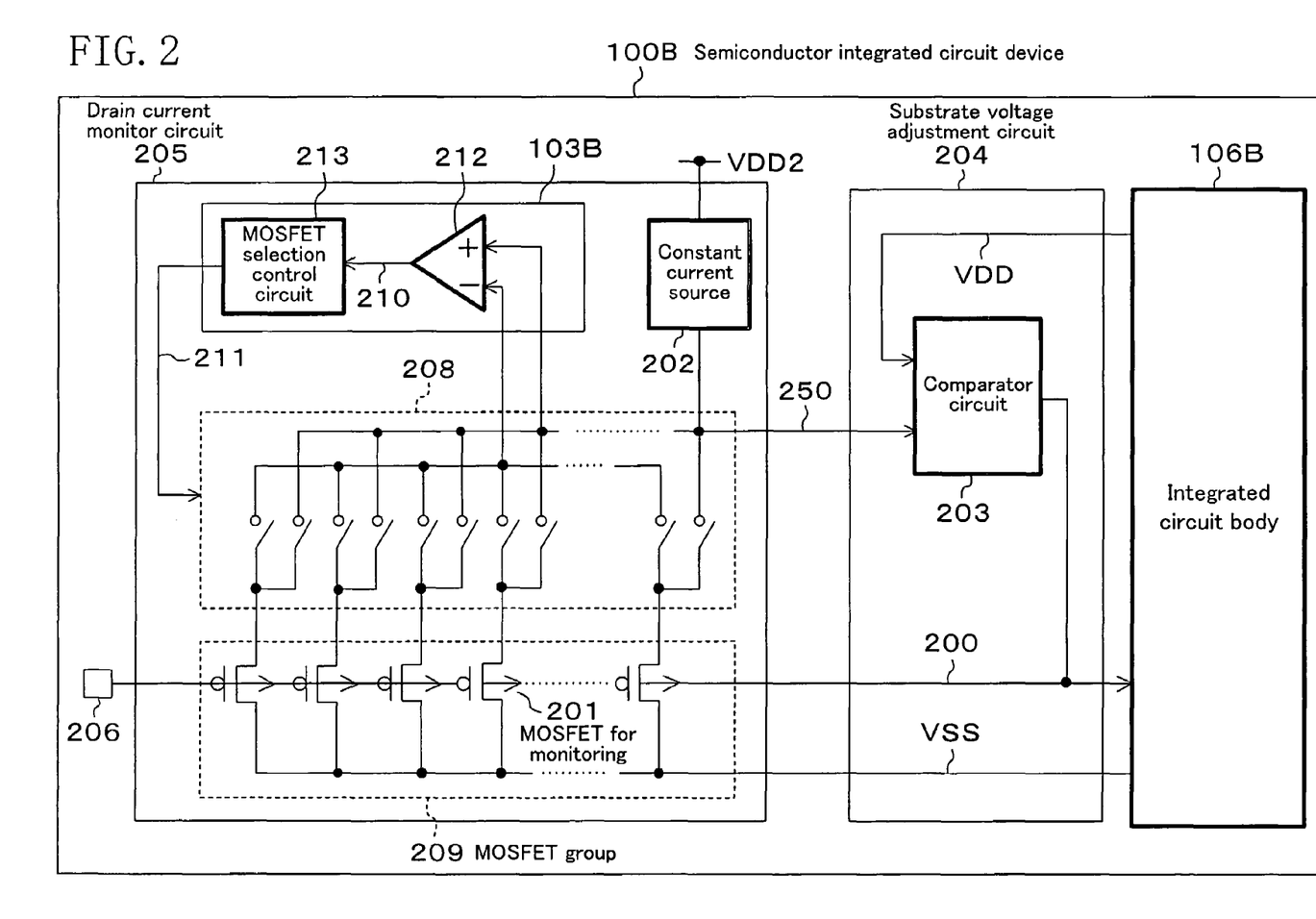
FIG. 2 is a block diagram of the entire configuration of a semiconductor integrated circuit device of Embodiment 2.

FIG. 2 is a block diagram showing the entire configuration of a semiconductor integrated circuit device of Embodiment 2 of the present invention.

Referring to FIG. 2, a semiconductor integrated circuit device 100B includes: an integrated circuit body 106B having a plurality of MOSFETs formed on a semiconductor substrate (not shown); a substrate voltage adjustment circuit (operation parameter adjustment circuit) 204 for adjusting a substrate voltage 200 of the semiconductor substrate; and a drain current monitor circuit (monitor circuit) 205.

The drain current monitor circuit 205 includes: a constant current source 202; a MOSFET group 209 composed of a plurality of MOSFETs (a plurality of elements to be measured); a switch array 208; and a selection section 103B for selecting an element to be measured for monitoring. The gate voltage of the MOSFET group 209 is set at a given voltage 206 that is equal to or less than the power supply voltage VDD of the integrated circuit body 106B. The MOSFET group 209 is formed on the same substrate as the plurality of MOSFETs in the integrated circuit body 106B.

Two MOSFETs are selected from the MOSFET group 209 by switching the switch array 208 with a switch array selection signal 211 outputted from a MOSFET selection control circuit 213 of the selection section 103B. A comparator circuit 212 of the selection section 103B compares the drain current values (measured parameter) of the selected two MOSFETs with each other to tell which is greater or smaller. Depending on the comparison result 210, the switch array 208 is again switched with the switch array selection signal 211, and in this way, the comparator circuit 212 repeats comparing two MOSFETs selected from the MOSFET group 209 with each other sequentially. By repeating this magnitude comparison, the drain current monitor circuit 205 selects a MOSFET whose drain current is the maximum, the minimum or the median as a MOSFET 201 for monitoring (element to be measured for monitoring), and outputs a drain current value (measured parameter) 250 of the MOSFET for monitoring to the downstream substrate voltage adjustment circuit 204.

The substrate voltage adjustment circuit 204 includes a comparator circuit 203 for comparing the source voltage of the MOSFET 201 for monitoring with a preset reference potential VDD in the state of the drain terminal of the MOSFET 201 for monitoring and the drain terminals of the plurality of MOSFETs in the integrated circuit body 106B being connected to the ground potential VSS. The comparison result from the comparator circuit 203 is fed back to the substrate voltage 200 of the MOSFET 201 for monitoring to thereby adjust the substrate voltage 200.

When the integrated circuit body 106B is a memory macro such as a static RAM (SRAM) having an array of a plurality of memory cells, the operation speed of the integrated circuit body 106B is determined with the drain current value of a MOSFET whose drain current is the smallest among MOSFETs driving inside the memory macro.

Figure 3:
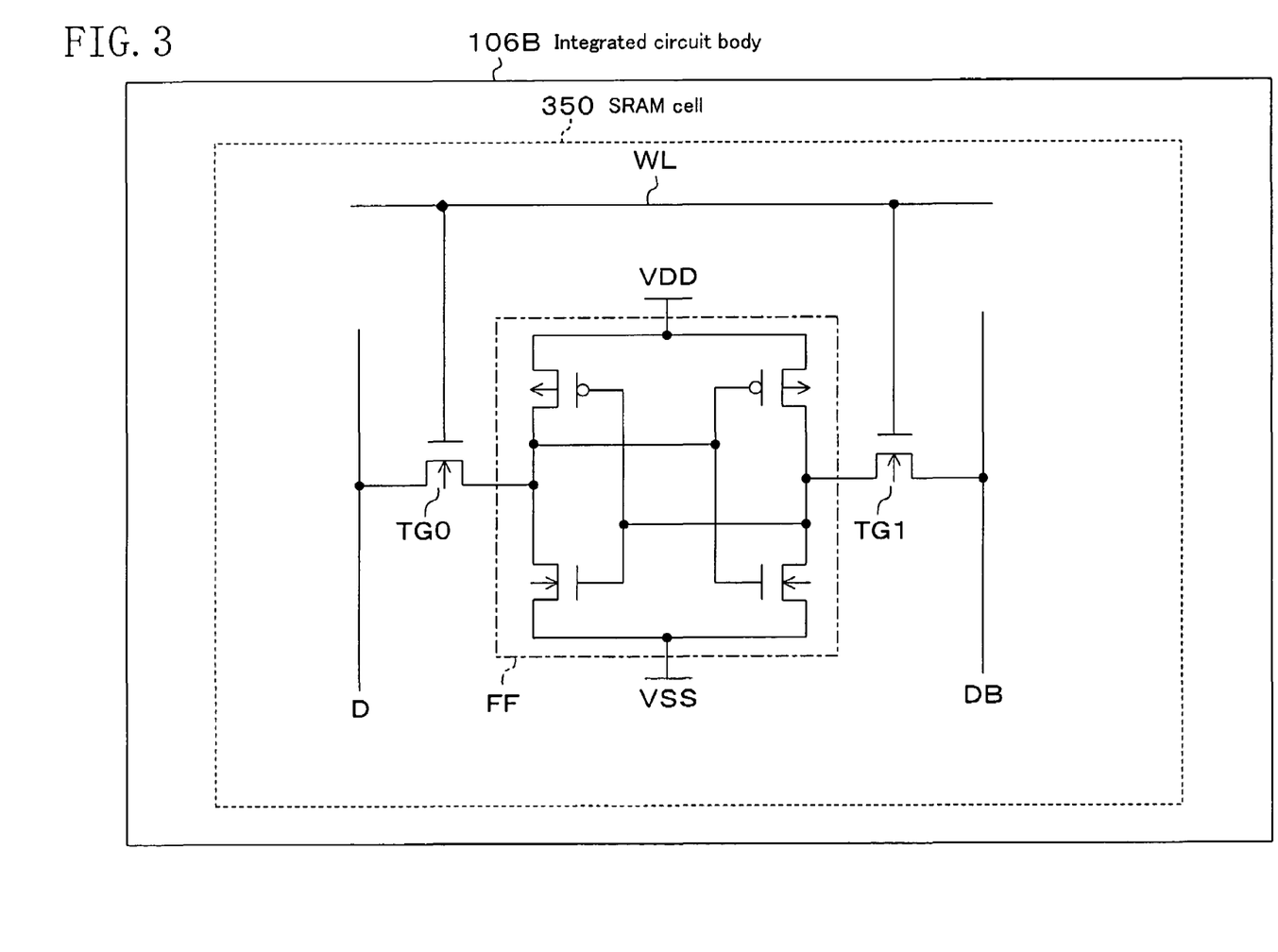
FIG. 3 is a block diagram of a major portion of a SRAM.

FIG. 3 is a block diagram of a major portion of a SRAM, in which only one SRAM cell is shown.

Referring to FIG. 3, a SRAM cell 350 in the integrated circuit body 106B includes: a flipflop FF composed of two inverters; two transfer gates TG0 and TG1 driven with a word line WL; and data lines D and DB.

The read speed of the SRAM cell 350 is determined with the magnitude of the drain current of the MOSFETs driving the data lines D and DB. As the drain current value is smaller, the read speed is lower, and the operation speed of the entire integrated circuit body (memory macro) 106B is determined with the operation speed of a SRAM cell (memory cell) whose read speed is lowest. Therefore, the operation speed of the entire memory macro is determined with the drain current value of a MOSFET having the smallest drain current among MOSFETs driving the data lines D and DB for the SRAM cells. In view of this, by selecting a MOSFET having the minimum drain current value from the MOSFET group 209 in FIG. 2 as the MOSFET 201 for monitoring, the operation stability of the integrated circuit body 106D can be attained.

Although the memory macro was SRAM in the above description, substantially the same effect will be obtained when it is dynamic RAM (DRAM), flash memory, resistive RAM (RRAM), phase-change RAM (PRAM), ferroelectric RAM (FeRAM) and magnetic RAM (MRAM).

When the integrated circuit body 106B is a logic path, the operation speed of the integrated circuit body 106B is determined with the average drain current value of a plurality of MOSFETs constituting the logic path.

If the logic path has N stages, variations in delay time caused by local variations are compressed in proportion to the inverse of the square root of N. Therefore, a MOSFET whose drain current is the median in the MOSFET group 209 is selected as the MOSFET 201 for monitoring.

As described above, in the semiconductor integrated circuit device 100B of this embodiment, having the MOSFET group 209 composed of a plurality of MOSFETs, a MOSFET whose drain current is the minimum or the median is selected as the MOSFET 201 for monitoring, and the substrate voltage 200 supplied to the integrated circuit body 106B is controlled according to the drain current of the MOSFET 201 for monitoring. This permits attainment of lower power consumption in the semiconductor integrated circuit device 100B.

In this embodiment, by placing the drain current monitor circuit 205 and the substrate voltage adjustment circuit 204 at positions close to the integrated circuit body 106B, it is possible to obtain a measured parameter closer to the characteristics of the integrated circuit body 106B and adjust the operation parameter using such a measured parameter.

Embodiment 3

Figure 4:
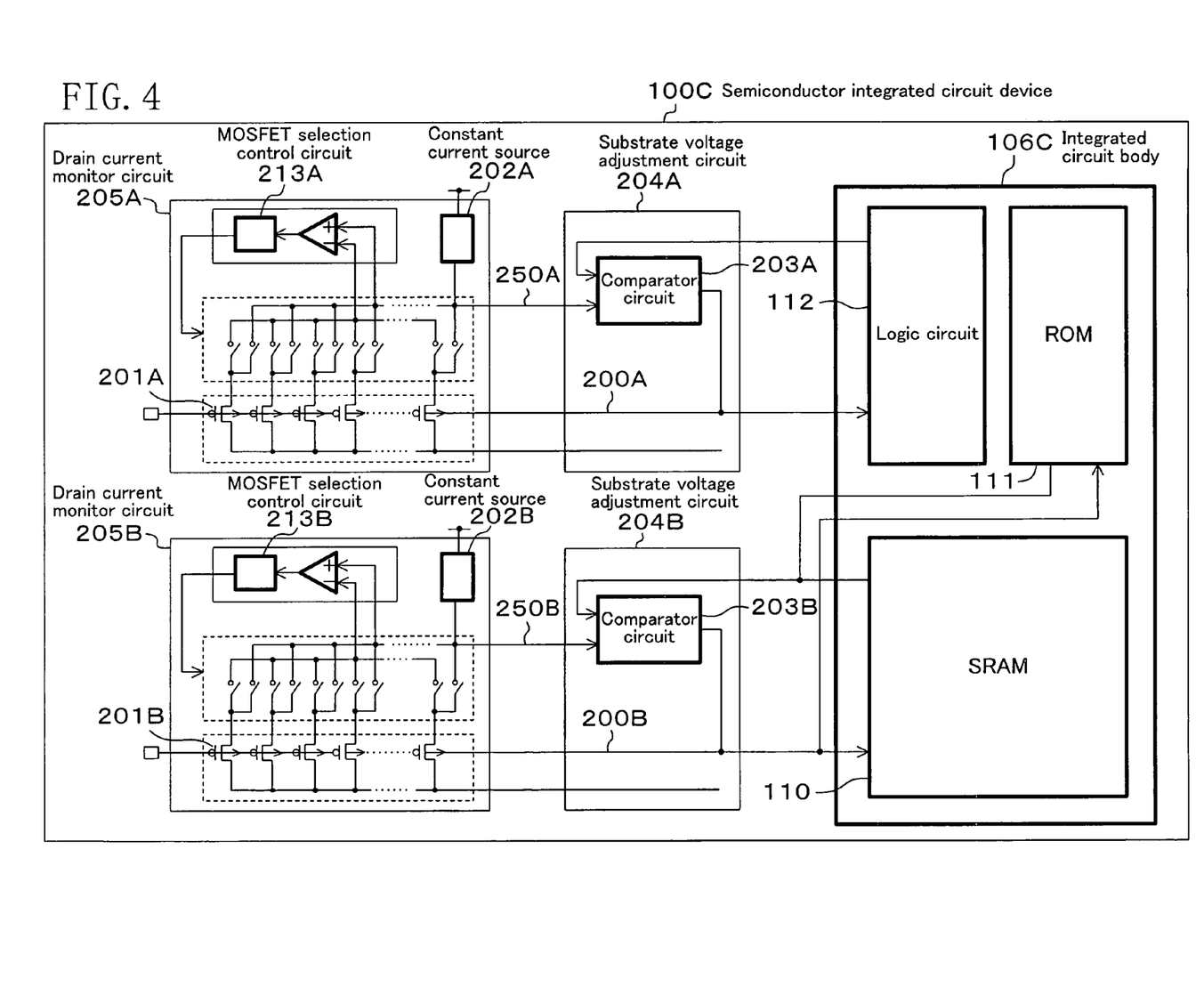
FIG. 4 is a block diagram of the entire configuration of a semiconductor integrated circuit device of Embodiment 3.

FIG. 4 is a block diagram of the entire configuration of a semiconductor integrated circuit device of Embodiment 3 of the present invention.

A semiconductor integrated circuit device 100C of this embodiment is different from the semiconductor integrated circuit device 100B of Embodiment 2 shown in FIG. 2 only in that an integrated circuit body 106C has three circuit blocks, that is, a SRAM 110, a ROM 111 and a logic circuit 112, therein and that two substrate voltage adjustment circuits 204A and 204B and two drain current monitor circuits 205A and 205B are provided. The other part of the configuration of this embodiment is the same as Embodiment 2 and therefore description thereof is omitted here.

The operation speed of the logic circuit 112 is determined with the average drain current value of a plurality of MOSFETs constituting a logic path. In adjustment of a substrate voltage 200A of the logic circuit 112, therefore, a MOSFET whose drain current is the median is selected as a MOSFET 201A for monitoring.

Contrarily, the operation speed of the ROM 111 ad the SRAM 110 is determined with the smallest one of the drain current values of driving MOSFETs. In adjustment of a substrate voltage 200B of the ROM 111 and the SRAM 110, therefore, a MOSFET whose drain current is the minimum is selected as a MOSFET 201B for monitoring.

As described above, in this embodiment, MOSFETs different in ranks depending on the circuit blocks in the integrated circuit body 106C are selected as the MOSFETs 201A and 201B for monitoring, to adjust the corresponding substrate voltages 200A and 200B. In this way, improvement in operation speed and lower power consumption can be attained in the semiconductor integrated circuit device 100C.

In the semiconductor integrated circuit device 100C of this embodiment, the substrate voltages 200A and 200B supplied to the integrated circuit body 106C were adjusted. It goes without mentioning that other operation parameters such as the operation frequency and the power supply voltage may be adjusted.

Embodiment 4

Figure 5:
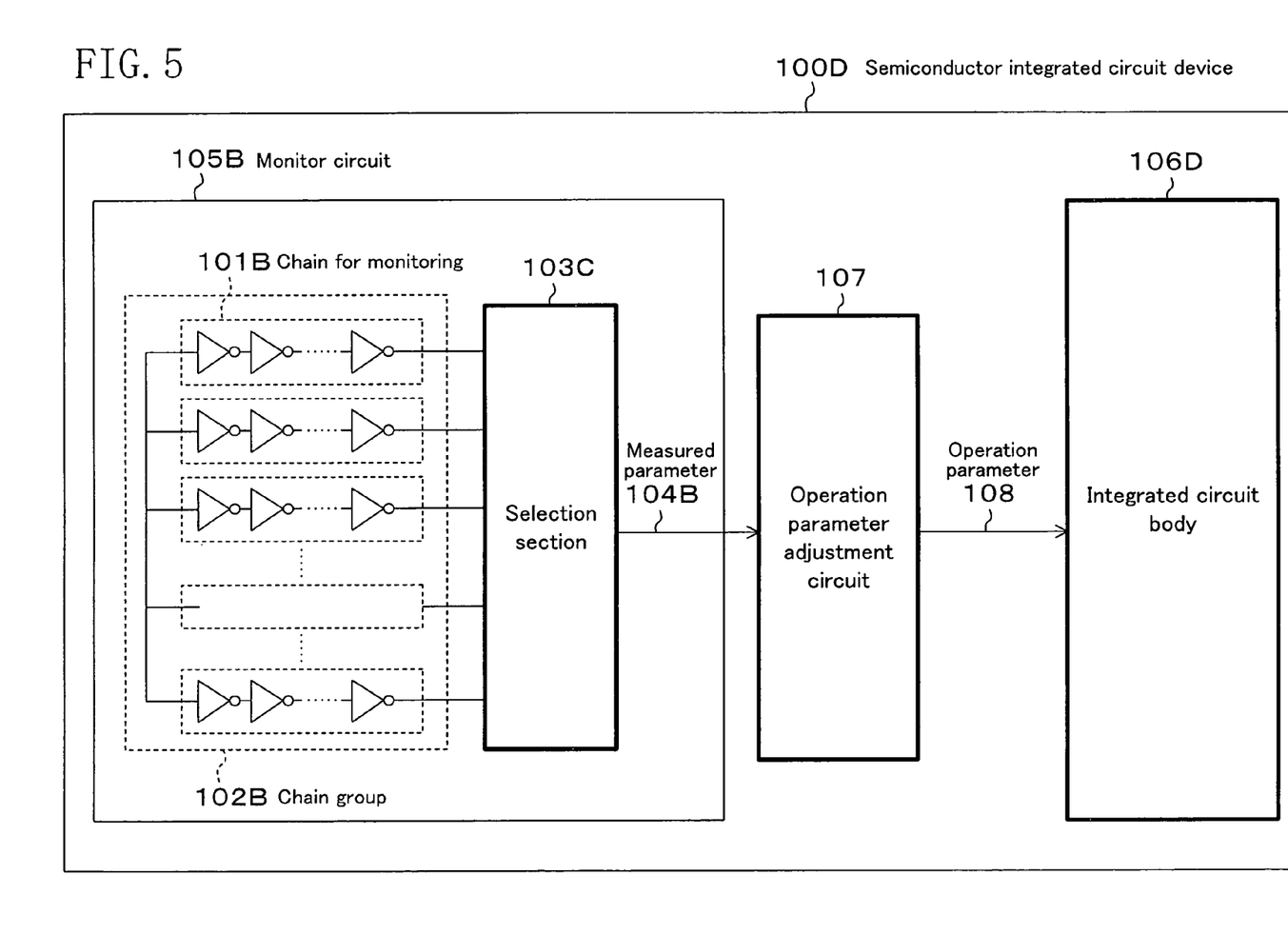
FIG. 5 is a block diagram of the entire configuration of a semiconductor integrated circuit device of Embodiment 4.

FIG. 5 is a block diagram of the entire configuration of a semiconductor integrated circuit device of Embodiment 4 of the present invention.

A semiconductor integrated circuit device 100D of this embodiment is different from the semiconductor integrated circuit device 100A of Embodiment 1 shown in FIG. 1 only in that a chain of a plurality of inverter circuits connected in series is used as an element to be measured and that the delay time of the chain is used as the measured parameter. The other part of the configuration of this embodiment is the same as Embodiment 1 and therefore description thereof is omitted here.

Referring to FIG. 5, a chain group 102B composed of a plurality of chains (a plurality of elements to be measured) is placed on the same substrate as an integrated circuit body 106D having a plurality of MOSFETs. Each chain in the chain group 102B includes a plurality of inverter circuits connected in series.

In this embodiment, a selection section 103C for selecting an element to be measured for monitoring selects a chain 101B for monitoring (element to be measured for monitoring) from the chain group 102B. In this selection, the delay time of each chain is measured as a measured parameter. The measured delay time (measured parameter) 104B of the chain 101B for monitoring is then supplied to the operation parameter adjustment circuit 107. With the use of the delay time 104B as the measured parameter of the chain 101B for monitoring, it is possible to secure high correlation with the path delay time of the integrated circuit body 106D. The operation parameter adjustment circuit 107 adjusts the operation parameter 108 such as the operation frequency, the substrate voltage and the power supply voltage according to the measured value. In this way, higher operation speed and lower power consumption can be attained in the semiconductor integrated circuit body 100D.

Embodiment 5

Figure 6:
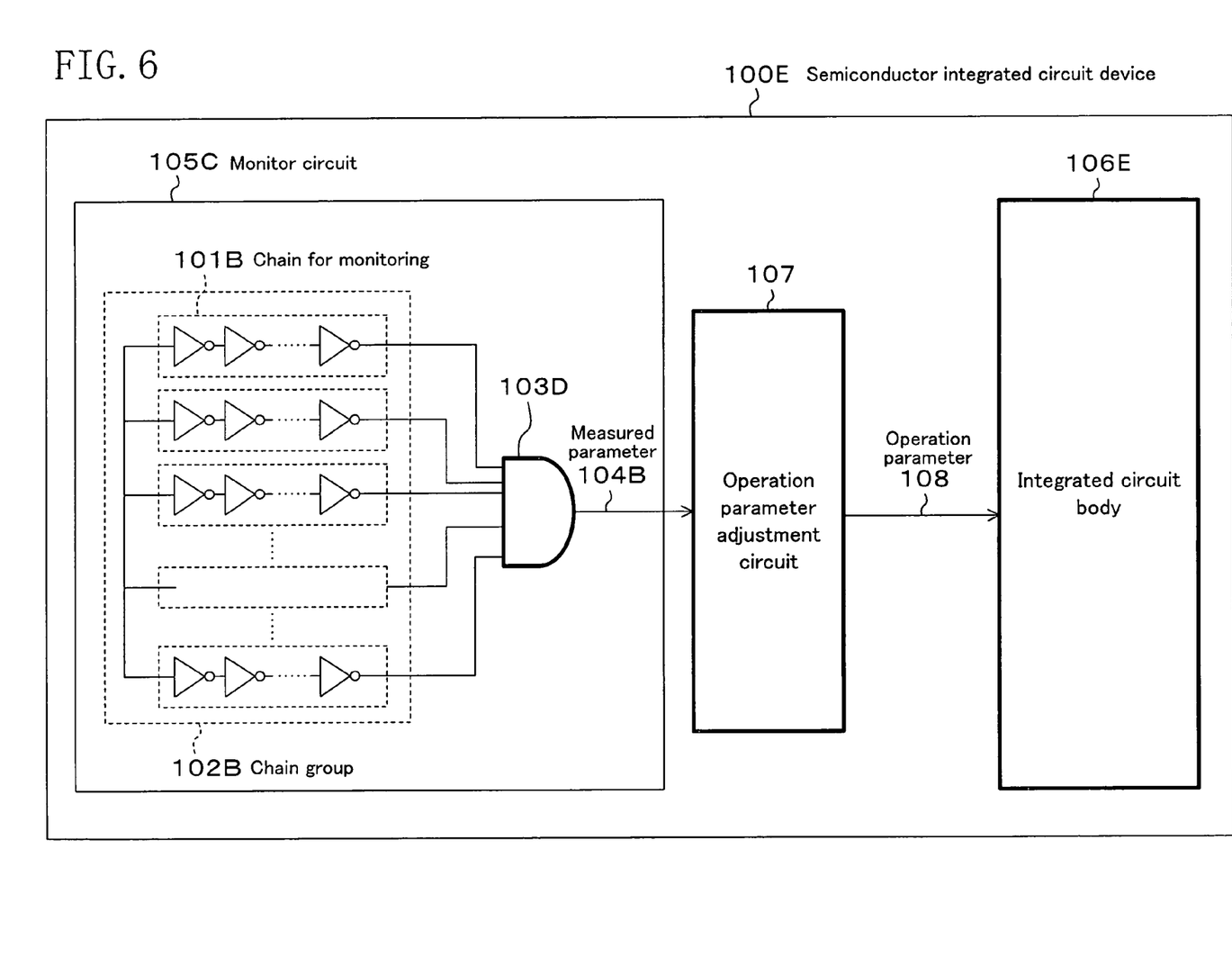
FIG. 6 is a block diagram of the entire configuration of a semiconductor integrated circuit device of Embodiment 5.

FIG. 6 is a block diagram of the entire configuration of a semiconductor integrated circuit device of Embodiment 5 of the present invention.

A semiconductor integrated circuit device 100E of this embodiment is different from the semiconductor integrated circuit device 100D of Embodiment 4 shown in FIG. 5 only in that a multi-input AND circuit 103D is used as the selection section for selecting an element to be measured for monitoring. The other part of the configuration of this embodiment is the same as Embodiment 4 and therefore description thereof is omitted here.

In the chain 101B for monitoring, which is composed of a plurality of inverter circuits connected in series, variations in delay time caused by local variations are compressed according to the number of stages of the chain. When an integrated circuit body 106E is a logic circuit and the logic path thereof has N stages, variations in delay time caused by local variations are compressed in proportion to the inverse of the square root of N.

In this embodiment, by use of the multi-input AND circuit 103D, the maximum delay time among the chains in which variations in delay time caused by local variations have been compressed is monitored and supplied to the operation parameter adjustment circuit 107.

As described above, in this embodiment, a measured parameter closer to the maximum delay time of a logic path in the integrated circuit body 106E is monitored. The operation parameter adjustment circuit 107 adjusts the operation parameter 108 such as the operation frequency, the substrate voltage and the power supply voltage using the measured parameter, and supplies the adjusted operation parameter 108 to the integrated circuit body 106E. Thus, improvement in the operation stability of the semiconductor integrated circuit device 100E can be attained.

Embodiment 6

Figure 7:
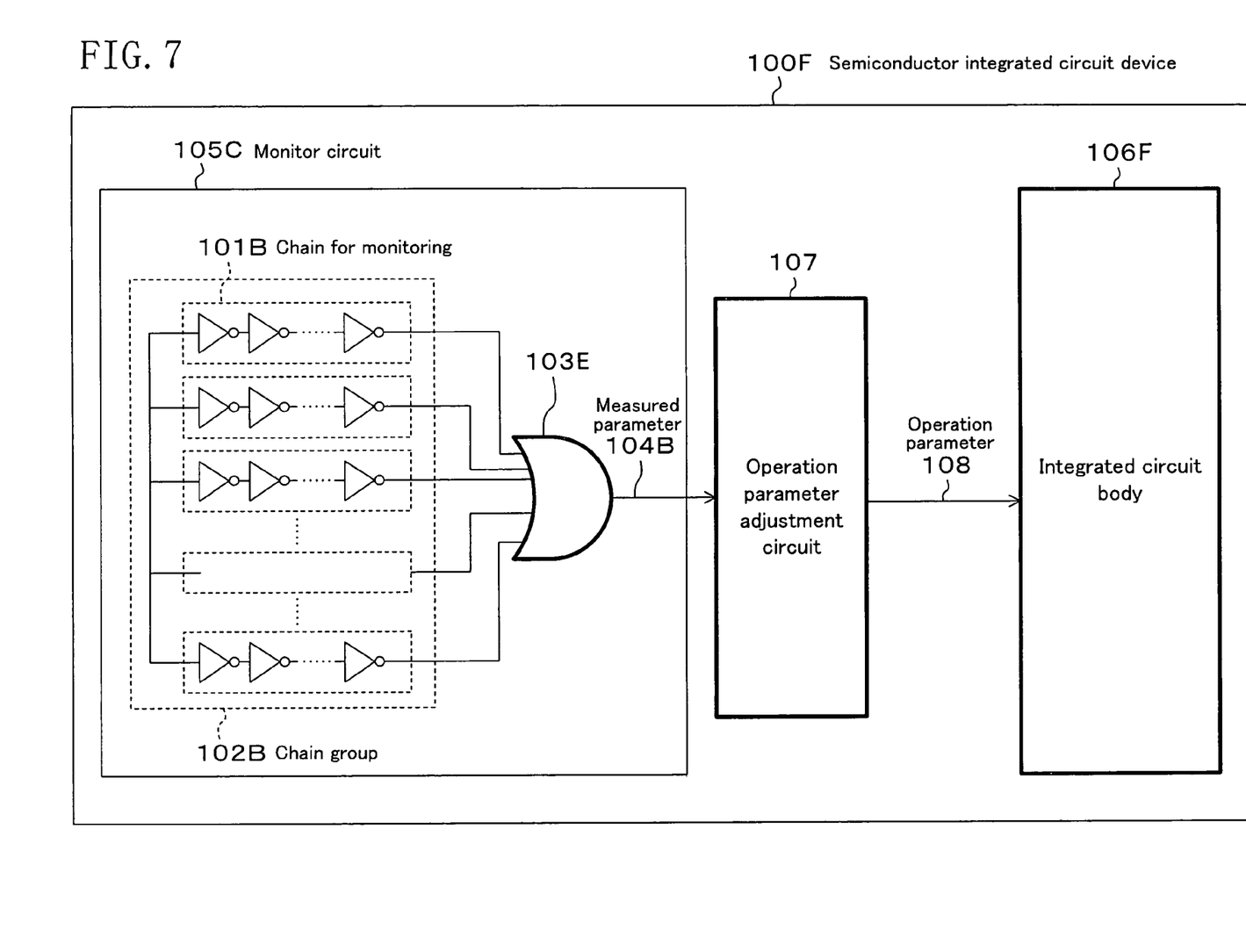
FIG. 7 is a block diagram of the entire configuration of a semiconductor integrated circuit device of Embodiment 6.

FIG. 7 is a block diagram of the entire configuration of a semiconductor integrated circuit device of Embodiment 6 of the present invention.

A semiconductor integrated circuit device 100F of this embodiment is different from the semiconductor integrated circuit device 100E of Embodiment 5 shown in FIG. 6 only in that a multi-input OR circuit 103E is used as the selection section for selecting an element to be measured for monitoring instead of the multi-input AND circuit 103D. The other part of the configuration of this embodiment is the same as Embodiment 5 and therefore description thereof is omitted here.

In this embodiment, by use of the multi-input OR circuit 103E, a chain having the minimum delay time among the plurality of chains in the chain group 102B can be selected as the chain 101B for monitoring. Thus, if an integrated circuit body 106F includes a short path in which a hold error is severe, such a hold error can be avoided, to thereby permit improvement in the operation stability of the semiconductor integrated circuit device 100F.

Such a short path in which a hold error is severe may be supplied with a substrate voltage or power supply voltage different from that supplied to the other circuit blocks in the integrated circuit body 106F, to thereby further improve the operation stability.

Embodiment 7

Figure 8:
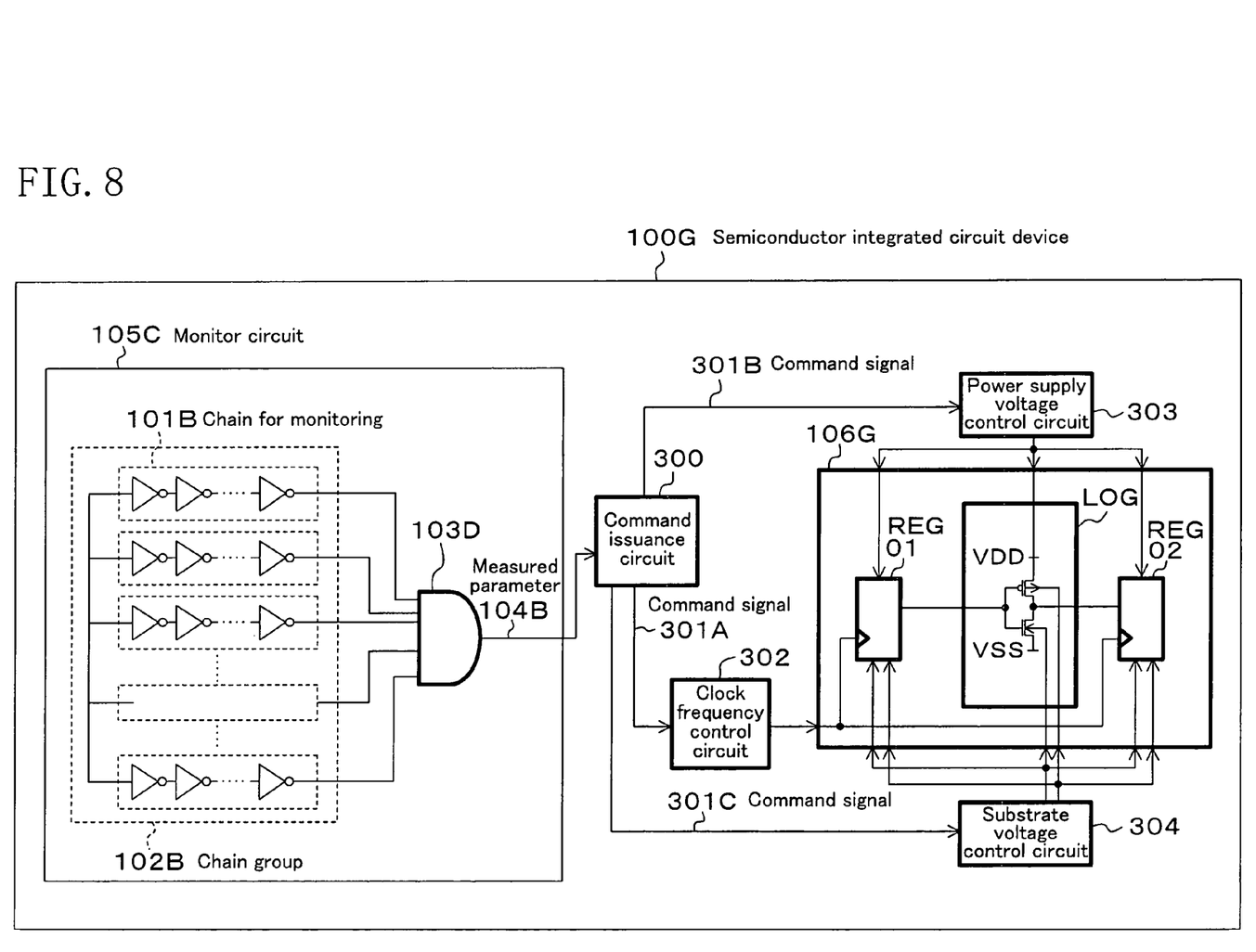
FIG. 8 is a block diagram of the entire configuration of a semiconductor integrated circuit device of Embodiment 7.

FIG. 8 is a block diagram of the entire configuration of a semiconductor integrated circuit device of Embodiment 7 of the present invention.

A semiconductor integrated circuit device 100G of this embodiment is different from the semiconductor integrated circuit device 100E of Embodiment 5 shown in FIG. 6 only in that a command issuance circuit 300, a clock frequency control circuit 302, a power supply voltage control circuit 303 and a substrate voltage control circuit 304 are provided downstream from the multi-input AND circuit 103D and that these three control circuits 302, 303 and 304 respectively adjust the clock signal, the power supply voltage and the substrate voltage supplied to the integrated circuit body 106G. The other part of the configuration of this embodiment is the same as Embodiment 5 and therefore description thereof is omitted here. The clock frequency control circuit 302, the power supply voltage control circuit 303 and the substrate voltage control circuit 304 constitute the operation parameter adjustment circuit.

In this embodiment, the maximum delay time 104B as the measured parameter of the element 100B to be measured for monitoring is supplied to the command issuance circuit 300. The command issuance circuit 300 issues command signals 301A, 301B and 301C based on the received maximum delay time 104B. The clock frequency control circuit 302 controls the operation frequency with the command signal 301A and supplies the resultant operation frequency to the integrated circuit body 106G. The power supply voltage control circuit 303 controls the power supply voltage with the command signal 301B and supplies the resultant power supply voltage to the integrated circuit body 106G. The substrate voltage control circuit 304 controls the substrate voltage with the command signal 301C and supplies the resultant substrate voltage to the integrated circuit body 106G.

In the case that the integrated circuit body 106G is a memory macro such as SRAM, DRAM and ROM in which a plurality of memory cells are arranged in an array, the operation speed thereof is under influence of the maximum value among the delay times of circuits driving the memory cells. In this embodiment, the monitor circuit 105C selects a chain giving the maximum delay time in the chain group 102B as the chain 101B for monitoring, and supplies the maximum delay time to the command issuance circuit 300 to give operation parameters such as the operation frequency, the substrate voltage and the power supply voltage in the worst case. The clock frequency control circuit 302, the power supply voltage control circuit 303 and the substrate voltage control circuit 304 respectively adjust the operation frequency, the power supply voltage and the substrate voltage and then supply the adjusted values to register circuits REG01 and REG02 and a logic circuit LOG.

As described above, in this embodiment, a chain having the maximum delay time is selected as the chain 101B for monitoring, to adjust the operation parameters presuming the worst case of the operation frequency, the power supply voltage and the substrate voltage supplied to the integrated circuit body 106G. Thus, improvement in the operation stability of the semiconductor integrated circuit device 100G can be attained.

The command signals 301A, 301B and 301C issued by the command issuance circuit 300 may be produced in response to instructions from the operating system, instructions from application software, signal input from outside the semiconductor integrated circuit device 100G, signal input from memory, the processing load amount of the integrated circuit body 106C and the like.

Embodiment 8

Figure 9:
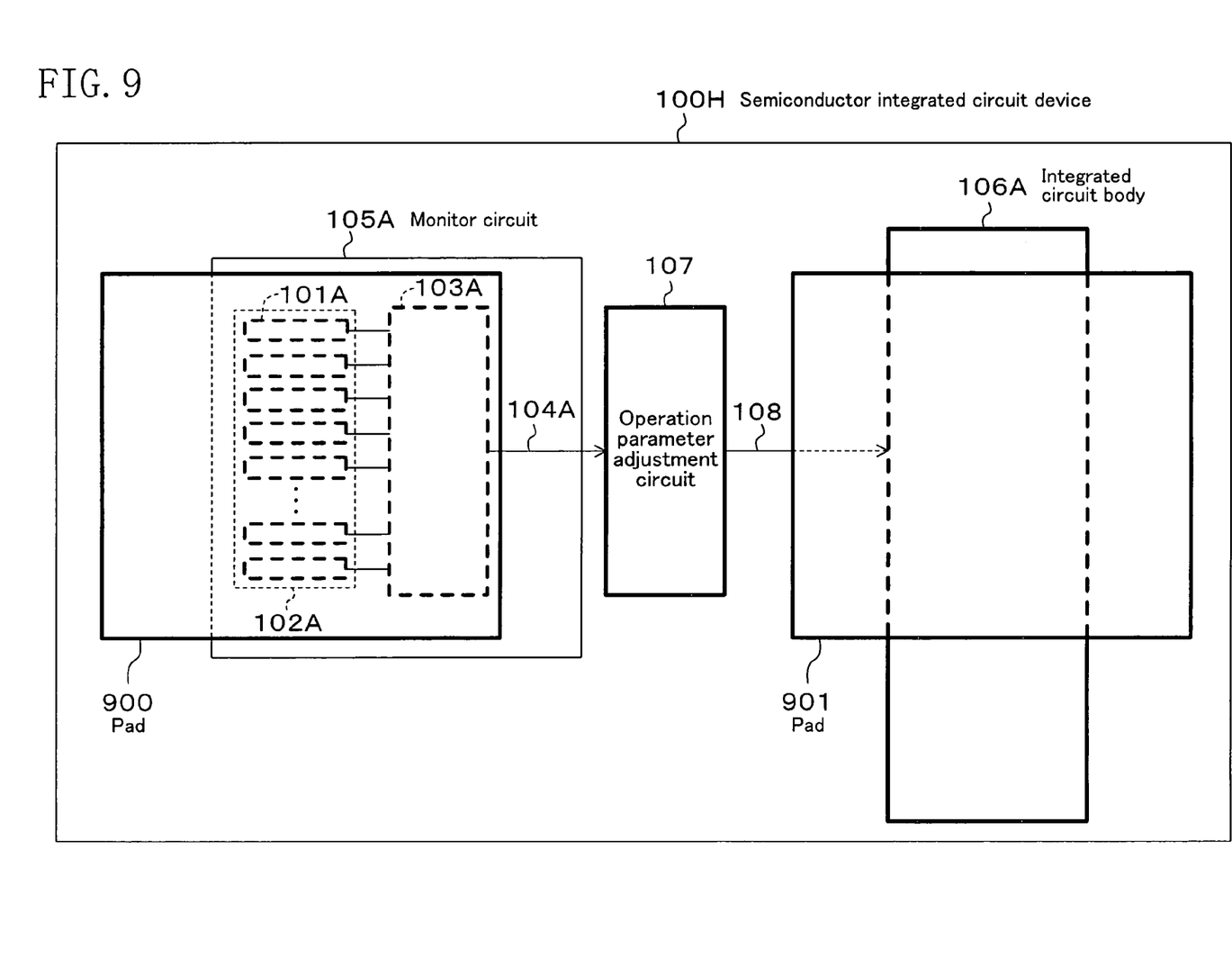
FIG. 9 is a block diagram of the entire configuration of a semiconductor integrated circuit device of Embodiment 8.

FIG. 9 is a block diagram of the entire configuration of a semiconductor integrated circuit device of Embodiment 8 of the present invention.

A semiconductor integrated circuit device 100H of this embodiment is different from the semiconductor integrated circuit device 100A of Embodiment 1 shown in FIG. 1 only in that the monitor circuit 105A is placed under a pad 900 and the integrated circuit body 106A is placed under a pad 901. The other part of the configuration of this embodiment is the same as Embodiment 1 and therefore description thereof is omitted here.

In this embodiment, part or the entire of the monitor circuit 105 having the element 101A to be measured for monitoring is placed under the pad 900. As shown in FIG. 9, the group 102A of a plurality of elements to be measured is located under the pad 900. Also, part or the entire of the integrated circuit body 106A is placed under the pad 901. Due to a stress exerted on the pads 900 and 901, the characteristics of the circuits underlying the pads will vary. In this relation, since both the monitor circuit 105A and the integrated circuit body 106A are placed under the pads 900 and 901, they will be equally subjected to such a stress.

As described above, in this embodiment, the same operation conditions are set for the integrated circuit body 106A and the element 101A to be measured for monitoring. The operation parameter 108 is therefore adjusted in the state that the integrated circuit body 106A and the element 101A to be measured for monitoring are under the same operation conditions. This permits adjustment of the operation parameter 108 with higher precision, and the semiconductor integrated circuit device 100H can attain improvement in operation speed and lower power consumption.

Since part or the entire of the monitor circuit 105A and part or the entire of the integrated circuit body 106A are placed under the pads 900 and 901, the chip area of the semiconductor integrated circuit device 100H can be reduced.

The chip area can further be reduced by placing part or the entire of the operation parameter adjustment circuit 107 under the pads 900 and 901.

The chip area can also be reduced, not only in the case of selecting the element 101A to be measured for monitoring from the group 102A of a plurality of elements to be measured, but also in the case of placing one element to be measured as the element to be measured for monitoring.

At least one of the monitor circuit 105A and the operation parameter adjustment circuit 107 may be formed near the pad 900 or 901.

Embodiment 9

Figure 10:
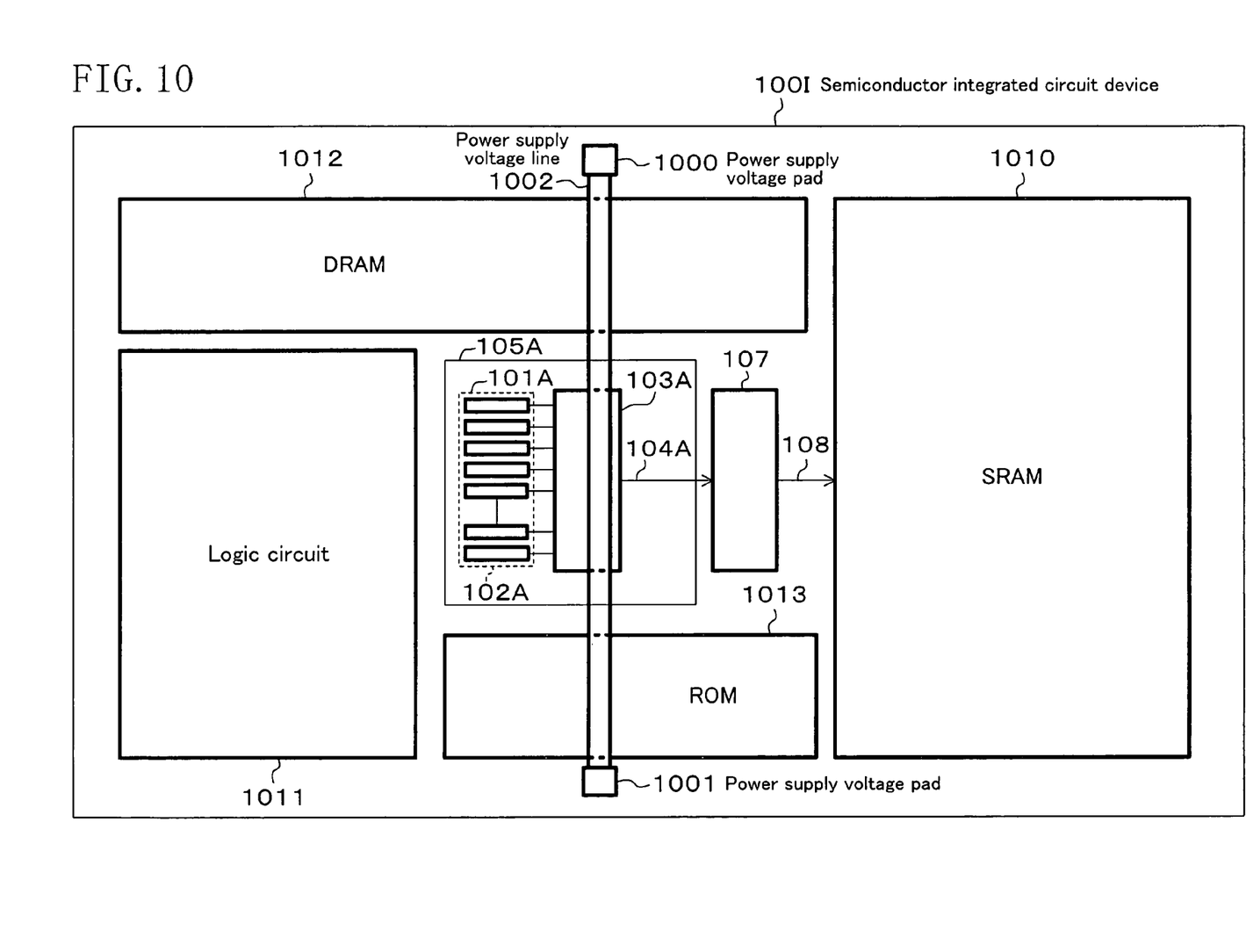
FIG. 10 is a block diagram of the entire configuration of a semiconductor integrated circuit device of Embodiment 9.

FIG. 10 is a block diagram of the entire configuration of a semiconductor integrated circuit device of Embodiment 9 of the present invention.

A semiconductor integrated circuit device 100I of this embodiment is different from the semiconductor integrated circuit device 100A of Embodiment 1 shown in FIG. 1 only in that the monitor circuit 105A, the operation parameter adjustment circuit 107 and the integrated circuit body 106A are placed under a power supply voltage line 1002. The other part of the configuration of this embodiment is the same as Embodiment 1 and therefore description thereof is omitted here. Note that the monitor circuit 105A and the operation parameter adjustment circuit 107 are placed in the center of a substrate constituting the semiconductor integrated circuit device 100I.

In this embodiment, the integrated circuit body 106A is composed of a SRAM 1010, a logic circuit 1011, a DRAM 1012 and a ROM 1013.

Referring to FIG. 10, the power supply voltage drop amount is the maximum at and around the center of the power supply voltage line 1002 connecting opposing power supply voltage pads 1000 and 1001 with each other. By placing the monitor circuit 105A and the operation parameter adjustment circuit 107 at and around the center of the line 1002, an element to be measured whose measured parameter 104A is degraded will be selected. With selection of such an element as the element 101A to be measured for monitoring, the operation parameter adjustment circuit 107 adjusts operation parameters according to the measured parameter 104A, such as the drain current value and the delay time, of the element 101A to be measured for monitoring even though the measured parameter 104A is degraded, and supplies the resultant operation parameter 108 such as the operation frequency, the substrate voltage and the power supply voltage to the SRAM 1010. This permits improvement in operation speed and lower power consumption in the semiconductor integrated circuit device 100I.

Although the operation parameter 108 is supplied only to the SRAM 1010 in this embodiment, it may also be supplied to the logic circuit 1011, the DRAM 1012, the ROM 1013 and the like.

As described above, in the semiconductor integrated circuit device 100I of this embodiment, a plurality of elements to be measured are provided, parameters of the respective elements are measured, and an element whose measured parameter is in a predetermined rank is selected as the element to be measured for monitoring, to be used for adjustment of an operation parameter. Therefore, even if the plurality of elements to be measured have their local variations, the operation parameter can be adjusted with a reduced influence of variations in measured parameter due to the local variations.

Only either one of the monitor circuit 105A and the operation parameter adjustment circuit 107 may be formed in the center of the substrate constituting the semiconductor integrated circuit device 100I.

As described above, according to the present invention, the operation parameter is adjusted with a reduced influence of fabrication variations in which an element to be measured itself varies locally and randomly during fabrication. The present invention is therefore particularly useful as a semiconductor integrated circuit device attaining improvement in operation speed and reduction in power consumption.

While the present invention has been described in preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A semiconductor integrated circuit device comprising:
   an integrated circuit body having a plurality of MOSFETs on a semiconductor substrate;
   a plurality of elements to be measured placed on the same substrate as the plurality of MOSFETs;
   a comparator for performing magnitude comparison of measured parameters of the plurality of elements to be measured;
   a monitor circuit for determining an order of magnitude of the measured parameters of the plurality of elements to be measured based on a result of the magnitude comparison of the comparator, and selecting an element to be measured for monitoring from the plurality of elements to be measured based on the determined order; and
   an operation parameter adjustment circuit for adjusting an operation parameter supplied to the integrated circuit body based on the measured parameter of the element to be measured for monitoring.

2. The device of claim 1, wherein the monitor circuit selects an element to be measured whose measured parameter value is any one of the maximum, the minimum and the median from the plurality of elements to be measured as the element to be measured for monitoring, and
   the operation parameter adjustment circuit adjusts at least one operation parameter among the operation frequency, the power supply voltage and the substrate voltage supplied to the integrated circuit body.

3. The device of claim 1, wherein each of the plurality of elements to be measured is a MOSFET, and
   the measured parameter is a drain current at a gate voltage value in a subthreshold range or saturation range of the MOSFET.

4. The device of claim 3, wherein when a circuit block of the integrated circuit body is a memory, the monitor circuit selects a MOSFET whose drain current value is the minimum as the element to be measured for monitoring.

5. The device of claim 4, wherein the memory is SRAM, DRAM, ROM, flash memory, RRAM, PRAM, FeRAM or MRAM.

6. The device of claim 3, wherein when a circuit block of the integrated circuit body is a logic circuit, the monitor circuit selects a MOSFET whose drain current value is the median as the element to be measured for monitoring.

7. The device of claim 1, wherein the monitor circuit includes a plurality of monitor circuits and the operation parameter adjustment circuit includes a plurality of operation parameter adjustment circuits, and
   the plurality of monitor circuits and the plurality of operation parameter adjustment circuits are placed on a same substrate.

8. The device of claim 7, wherein the integrated circuit body is composed of a plurality of circuit blocks,
   the plurality of monitor circuits and the plurality of operation parameter adjustment circuits are provided to correspond to the plurality of circuit blocks, and
   at least one of the plurality of monitor circuits selects an element to be measured whose measured parameter value is in a rank different from that in the other monitor circuits as the element to be measured for monitoring.

9. The device of claim 1, wherein at least one of the monitor circuit and the operation parameter adjustment circuit is formed close to the integrated circuit body.

10. The device of claim 1, further comprising a pad,
    wherein at least one of the monitor circuit and the operation parameter adjustment circuit is formed near the pad, or formed partly or entirely under the pad.

11. The device of claim 1, wherein at least one of the monitor circuit and the operation parameter adjustment circuit is formed in the center of the substrate.

12. The device of claim 1, further comprising a pad,
    wherein part or the entire of at least one of the plurality of elements to be measured for monitoring and part or the entire of the integrated circuit body are formed under the pad.

* * * * *